United States Patent [19]

Lutz et al.

[11] Patent Number: 5,011,627

[45] Date of Patent: Apr. 30, 1991

[54] SCREEN-PRINTABLE PASTE FOR MANUFACTURING ELECTRICALLY CONDUCTIVE COATINGS

[75] Inventors: Klaus Lutz, Rodenbach; Hans-Joachim Baer, Frankfurt; Karl-Anton Starz, Rodenbach; Werner Leske, Gelnhausen; Harry Mueller, Rodenbach, all of Fed. Rep. of Germany

[73] Assignee: Degussa Aktiengesellschaft, Frankfurt am Main, Fed. Rep. of Germany

[21] Appl. No.: 319,683

[22] Filed: Mar. 7, 1989

[30] Foreign Application Priority Data

Mar. 19, 1988 [DE] Fed. Rep. of Germany ....... 3809331

[51] Int. Cl.$^5$ .............................................. H01B 1/06
[52] U.S. Cl. .................................... 252/512; 252/514; 523/457; 523/458; 523/459
[58] Field of Search ................ 252/512, 514; 523/457–459; 524/439

[56] References Cited

U.S. PATENT DOCUMENTS

| | | | |
|---|---|---|---|
| 4,410,457 | 10/1983 | Fujimura et al. | 252/514 |
| 4,479,890 | 10/1984 | Prabhu et al. | 523/457 |

*Primary Examiner*—Josephine Barr
*Attorney, Agent, or Firm*—Beveridge, DeGrandi & Weilacher

[57] ABSTRACT

Membrane keyboards are manufactured using screen-printable, electrically conductive pastes consisting of 40 to 75% by weight of metal powder (silver, aluminum, copper and their mixtures), 5 to 55% by weight of an organic solvent and 5–20% by weight of and synthetic resin based on a thermoplastic epoxy or phenoxy resin with an average molecular weight of 10,000 to 250,000 and an epoxide content of 0 to 1.

3 Claims, No Drawings

SCREEN-PRINTABLE PASTE FOR MANUFACTURING ELECTRICALLY CONDUCTIVE COATINGS

INTRODUCTION AND BACKGROUND

The present invention relates to a screen-printable paste which contains 40 to 75% by weight of an electrically conductive metal powder namely silver, aluminum, or copper and mixtures thereof, 5 to 20% by weight of an organic synthetic resin and 5 to 55% by weight of an organic solvent for producing electrically conductive coatings on flexible plastic sheets [sheetings, foils, films], especially for manufacturing membrane keyboards.

In order to produce thin, electrically conductive circuits on flexible substrates such as e.g. polyester sheets, screen-printable conductive pastes are required which must also be flexible after drying. The main area of application for these pastes are membrane keyboards, which were introduced into the market a few years ago and have gained increasing acceptance in the marketplace as a result of technical improvements. Membrane keyboards are presently used primarily in consumer electronics as well as in the operating elements of machines and other technical apparatus.

The basic design for membrane keyboards is described in DIN 42 115 (draft). According to it, the main component is a membrane keyboard display consisting of many individual membrane switch elements. Membrane keyboards and therewith also the membrane switch elements are generally constructed out of 3 layers.

The first layer consists of a flexible base sheet (usually polyethylene terephthalate) which is printed with a conductive paste using the screen-printing method and is subsequently dried at temperatures under 200° C. A so-called spacer sheet is applied thereupon (adhesive on both sides) which comprises apertures at the contact points. The third layer is again usually a polyester sheet which is printed on the inner side with a conductive paste using the screen-printing method and subsequently dried. A contact between the conductive circuits of the first and of the third layer is created by means of external pressure on the uppermost (third) layer at especially designated positions (spacer apertures) in corresponding screen-print patterns. If a voltage is placed at the same time on two conductive circuit planes, a short-circuit current then flows which releases a control impulse.

Membrane keyboards exist in many variations. They can basically be divided into systems without and with pressure point (so-called dome). As a result of the increasingly greater demand for tactile response (feedback) in membrane keyboards, development is headed in the direction of variants with a stamped [impressed] dome. This involves a hot deformation of the sheet with the applied conductive circuits which places very high requirements on the flexibility, long-term adhesion and fatigue strength under reversed bending stresses of the conductive tracks.

In the prior art, U.S. Pat. No. 4,425,263 and EP-PS No. 0,068,168 describe screen-printable, electrically conductive pastes consisting of a conductive metal powder, an organic binder component and an organic solvent whose organic binder component consists of an aromatic polyester resin. Certain sheet resistivity values are achieved which, however, rise drastically after creasing or bending of the printed conductive circuits since the conductive circuits produced with these pastes are not sufficiently flexible and break.

U.S. Pat. No. 4,592,961 teaches an improvement of the flexibility of silver conductive circuits if a vinylidene copolymer is added to the aromatic polyester lacquer resin. However, such pastes gel quite rapidly and are then no longer screen-printable.

The use of epoxy resins for producing conductive masses and conductive pastes is known. Thus, U.S. Pat. No. 3,746,662 describes a conductive silver epoxy-resin adhesive which is used to fasten components to substrate materials. This adhesive consists of a low-molecular, liquid epoxy resin and contains an additional hardener component. It is not suitable for membrane keyboards due to its brittleness in the hardened state.

SUMMARY OF THE INVENTION

An object of the invention is to provide a screen-printable paste formed of 40 to 75% by weight of an electrically conductive metal powder based on silver, aluminum, copper and their mixtures, 5 to 20% by weight of an organic synthetic resin and 5 to 55% by weight of an organic solvent for the production of electrically conductive coatings on flexible plastic sheets, especially for the manufacture of membrane keyboards, with which paste bend-resistant conductive circuits with a long-term stability can be produced. In addition, the applied conductive circuits should be deformable under heat and exhibit good adhesion to the plastic sheets as well as a high resistance to cracking and scratching.

In attaining the above and other features of the invention there is used a thermoplastic epoxy or phenoxy resin with an average molecular weight of 10,000 to 250,000 and an epoxide content of (equ./kg) 0 to 1 as organic synthetic resin.

Epoxy or phenoxy resins are used with preference which are prepared from bisphenol A and epichlorohydrin. In particular, glycol ethers, glycol ether esters, glycol esters and hydrocarbons have proven themselves to be suitable as organic solvents.

These conductive pastes can be applied using the screen-printing method onto a flexible substrate material such as e.g. sheets of polyester, polycarbonate, polyimide, polyether sulfone (PES) or polyether ether ketone (PEEK) in a suitable pattern and subsequently dried at temperatures under 200° C. Surface coatings or conductive circuits with good electrical conductivity are produced thereby.

In order to produce a membrane switch element, two equally large sheets are printed with the conductive paste using the screen-printing method in a pattern and dried. The upper (cover) sheet is then thermally deformed in a permanent manner in a suitable tool (dome stamping process).

Both sheets are subsequently pressed or adhered in an accurate manner, "in register", with inclusion of a spacer layer with apertures. The dynamic fatigue [long-term] tests (1 million short-circuit switching cycles) were performed with such membrane switch elements. After this test had been performed, the loop resistance of the system was measured.

As regards the silver powder used in the conductive plate, platelet-shaped particles (so-called "flakes") have proven to be especially suitable. The preferred tap densities of the platelet-shaped silver powder are in a range of 1.5–5 g/cm³. However, microcrystalline, dendritic or spherical silver powders can also be used. Platelet-shaped material with average grain sizes smaller than 15 μm is preferably used. Material with an average grain size smaller than 20 μm can be used as aluminum powder.

The necessary thermoplastic resin from the class of epoxy or phenoxy resins must exhibit an average molecular weight between 10,000 and 250,000. Bisphenol A and epichlorohydrin are preferably used as structural component of such resins; however, epoxy resins with a different structure can also be used. The resins resulting therefrom must have an epoxide content smaller than 1 (equ./kg). It should preferably be smaller than 0.5 in the case of epoxy resins. The epoxide content in the phenoxy resins is 0 by definition. The term epoxide content signifies the number of epoxide equivalents (val) [gram equivalent]) in 1000 g resin (equ./kg).

An epoxy content smaller than 1 therefore means that the number of reactive terminal epoxide groups of the resin is very small. Thus, such resins can be processed without additional hardener.

All organic solvents with a good dissolving capacity can be used as solvent, especially mixtures from the class of glycol ethers or glycol ether acetates, but also aromatic or aliphatic hydrocarbons. Other auxiliary lacquer aids can of course be added. Thus, the addition of plasticizers and soft resins for raising the flexibility is generally known.

The addition of stabilizers, deaerators, foam inhibitors, thixotropic agents, and other conventional ingredients to the conductive pastes of the invention for the purpose of contributing their expected function is also possible.

DETAILED DESCRIPTION OF INVENTION

Figure 1:
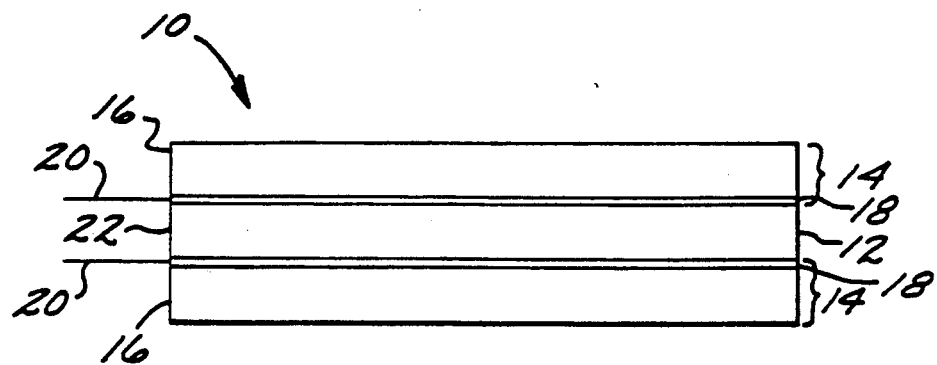
Figure 2:
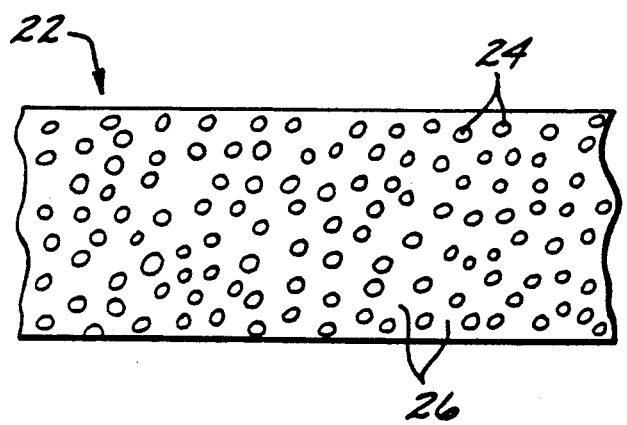

The following examples are intended to illustrate the invention in more detail:

1. A solution of 40% by weight phenoxy resin PKHH (Union Carbide; molecular weight 20,000–30,000, epoxide content 0) is prepared in 60% by weight ethyl diglycol acetate. 22.5% by weight of this resin solution are mixed with 60% by weight platelet-shaped silver powder (tap density 3.5 g/cm³) and 17.5% by weight ethyl diglycol acetate and processed to a paste. The paste exhibits a viscosity of approximately 5500 mPas (measured with a HAAKE Rotovisco RV 20, Pk I, 0.3°, D=200 sec⁻¹, T=20° C.).

The preparation is applied using the screen-printing method onto polyester sheets (type Hostaphan RN 125, Kalle, Wiesbaden) and dried for 30 min at 120° C.

Conductive circuits with a very good electrical conductivity are obtained which exhibit a sheet resistivity of approximately 40 mΩ/□ (in relation to a layer thickness of 10 μm). No deterioration of the sheet resistivity occurs after storage of the conductive circuits under climatic conditions of 85° C./85% rel. moisture for 1000 hours.

A membrane switch element is manufactured with this conductive paste. The conductive circuit is screen printed thereby onto a thin polyester sheet, dried at 120° C. for 30 min and this structure subsequently deformed at approximately 100° C. in a stamping device for creating a switching "dome". The switching sheet treated in this manner is fastened to a base sheet and a switching element is produced.

This membrane switch element is subjected to a fatigue test of 1 million switching cycles and the loop resistance of the system measured at the start and at the end of the test.

The membrane switch element completes 1 million switching cycles without failure, the initial value of the loop resistance is about 0.56Ω and the final value about 6.2Ω. The adhesion of the conductive paste to the switching dome is still very good even after 1 million switching cycles.

2. 65% by weight platelet-shaped silver powder (tap density 4.0 g/cm³) is mixed with 26% by weight of the epoxy resin solution Araldit GJ 488 E32 (Ciba-Geigy, Wehr; molecular weight approximately 20,000, epoxide value 0.15). 9% by weight ethyl diglycol acetate is subsequently added as dilution and a conductive paste prepared.

The paste exhibits a viscosity of approximately 4000 mPas (measured with a HAAKE Rotovisco RV 20, conditions as in example 1). The sheet resistivity of the preparation is 30 mΩ/□ (relative to a layer thickness of 10 μm). No deterioration of the sheet resistivity occurs after storage of the conductive tracks under the climatic conditions 85° C./85% rel. moisture for 1000 hours.

Membrane switch elements are manufactured with this paste in accordance with example 1 and subjected to a fatigue test of 1 million switching cycles. The membrane switch elements complete 1 million switching cycles without failure, the initial value of the loop resistance is about 0.42Ω and the end value about 2.5Ω.

Even after 1 million switching cycles, the adhesion of the conductive paste to the switching dome is very good.

3. 65% by weight platelet-shaped silver powder (tap density 3.5 g/cm³) is mixed with 26% by weight of the epoxy resin solution Ravepox H 362 (ENICHEM, Bad Homburg; molecular weight approximately 55,000, epoxide content not determinable). 9% by weight Solvesso 200 (Esso) is subsequently added and a conductive paste prepared.

The paste exhibits a viscosity of approximately 5000 mPas (measured with the HAAKE Rotovisco RV 20, conditions as in example 1). The sheet resistivity of the product is 40 mΩ/□ (relative to a layer thickness of 10 μm).

No deterioration of the sheet resistivity occurs after climatic storage under the conditions 85° C./85% rel. moisture for 1000 hours.

Membrane switch elements are again manufactured with this paste in accordance with example 1 and subjected to a fatigue test of 1 million switching cycles.

The membrane switch elements complete these switching cycles without failure and the adhesion of the layers is still very good after the test.

Further variations and modifications will be apparent to those skilled in the art and are intended to be incompassed by the claims apprended hereto.

German priority application P No. 38 09 331.6-42 is relied on and incompassed herein.

We claim:

1. A screen-printable paste consisting essentially of 40 to 75% by weight of an electrically conductive metal powder selected from the group consisting of silver, aluminum, copper and mixtures thereof, 5 to 20% by weight of an organic synthetic resin and 5 to 55% by weight of an organic solvent for producing electrically conductive coatings on a flexible plastic sheet wherein a thermoplastic epoxy or phenoxy resin with an average molecular weight of 10,000 to 250,000 and an epoxy content of 0 to 1 equ./kg is the organic synthetic resin.

2. The screen-printable paste according to claim 1, wherein the epoxy or phenoxy resins are prepared from bisphenol A and epichlorohydrin.

3. The screen-printable paste according to claim 1, wherein the solvent is a glycol ether, glycol ether ester, glycol ester or hydrocarbon.

* * * * *